(12) United States Patent
Schulte (10) Patent No.: US 10,985,024 B2
(45) Date of Patent: *Apr. 20, 2021

(54) SIMULTANEOUS HYDROPHILIZATION OF PHOTORESIST AND METAL SURFACE PREPARATION: METHODS, SYSTEMS, AND PRODUCTS

(71) Applicant: Ontos Equipment Systems, Chester, NH (US)

(72) Inventor: Eric Frank Schulte, Santa Barbara, CA (US)

(73) Assignee: ONTOS Equipment Systems, Inc., Chester, NH (US)

(*) Notice: Subject to any disclaimer, the term of this patent is extended or adjusted under 35 U.S.C. 154(b) by 0 days.

This patent is subject to a terminal disclaimer.

(21) Appl. No.: 16/552,314

(22) Filed: Aug. 27, 2019

(65) Prior Publication Data
US 2020/0234958 A1    Jul. 23, 2020

Related U.S. Application Data

(63) Continuation of application No. 14/940,052, filed on Nov. 12, 2015, now Pat. No. 10,438,804.
(Continued)

(51) Int. Cl.
*H01L 21/288* (2006.01)
*C25D 5/02* (2006.01)
(Continued)

(52) U.S. Cl.
CPC .......... *H01L 21/2885* (2013.01); *C25D 5/022* (2013.01); *C25D 5/34* (2013.01);
(Continued)

(58) Field of Classification Search
CPC .......... H01L 21/0206; H01L 21/02068; H01L 21/76879; H01L 21/76885; H01L 21/2885; H01L 23/5226; H01L 21/0273; H01L 21/0274; H01L 21/3105; H01L 21/31058; C25D 5/022; C25D 5/34; C25D 7/12; C25D 7/123; C25D 17/00
See application file for complete search history.

(56) References Cited

U.S. PATENT DOCUMENTS

| 4,367,123 | A | * | 1/1983 | Beck | ........................ | C25D 5/08 |
| | | | | | | 204/224 R |
| 2016/0057867 | A1 | * | 2/2016 | Yamauchi | ............ | H05K 3/0082 |
| | | | | | | 29/850 |

FOREIGN PATENT DOCUMENTS

JP         2016045971 A  *  8/2014

* cited by examiner

*Primary Examiner* — Bo B Jang
(74) *Attorney, Agent, or Firm* — Robert O. Groover, III; Gwendolyn G. Corcoran; Groover & Associates PLLC (57) ABSTRACT

Methods and systems for using the downstream active residuals of a reducing-chemistry atmospheric plasma to provide multiple advantages to pre-plating surface preparation with a simple apparatus. As the downstream active species of the atmospheric plasma impinge the substrate surface, three important surface preparation processes can be performed simultaneously:
1. Organic residue is removed from the surface of the plating base.
2. Oxidation is removed from the surface of the plating base.
3. All surfaces on the substrate are highly activated by the downstream active residuals thus creating a highly wettable surface for subsequent plating operations.

8 Claims, 7 Drawing Sheets

Related U.S. Application Data (60) Provisional application No. 62/078,598, filed on Nov. 12, 2014.

(51) Int. Cl.
*C25D 5/34* (2006.01)
*C25D 7/12* (2006.01)
*H01L 21/02* (2006.01)
*C25D 17/00* (2006.01)
*H01L 21/027* (2006.01)
*H01L 21/3105* (2006.01)
*H01L 21/768* (2006.01)

(52) U.S. Cl.
CPC ............... *C25D 7/12* (2013.01); *C25D 7/123* (2013.01); *C25D 17/00* (2013.01); *H01L 21/0206* (2013.01); *H01L 21/02068* (2013.01); *H01L 21/0273* (2013.01); *H01L 21/31058* (2013.01); *H01L 21/76879* (2013.01); *H01L 21/76885* (2013.01)

SIMULTANEOUS HYDROPHILIZATION OF PHOTORESIST AND METAL SURFACE PREPARATION: METHODS, SYSTEMS, AND PRODUCTS

CROSS-REFERENCE

Priority is claimed from 62/078,598, which is hereby incorporated by reference.

BACKGROUND

The present application relates to manufacture of integrated circuits and multichip modules, and more particularly to metal plating.

Note that the points discussed below may reflect the hindsight gained from the disclosed inventions, and are not necessarily admitted to be prior art.

Standard practices in plating include pre-plate surface preparations using solvents, acids, abrasives, surfactants, ultrasonic agitation, and vacuum plasma processes to remove organic contamination and surface oxidation of the substrate to be plated. Each of these surface preparation processes has distinct disadvantages such as toxic waste disposal, chemical damage to exposed surfaces of the substrate, mechanical damage to the substrate surface or other sensitive structures of the substrate composition, introduction of foreign particles to the surface, required rinsing of the surface after treatment and before plating, contamination of the plating bath from residues of these surface treatment methods, etc.

What is needed is a rapid and environmentally-friendly method of preparing surfaces for plating which leaves the surface in a pristine and optimal surface state for the subsequent plating process, and does not mechanically and/or chemically disturb sensitive substrates, and requires no rinsing of surface preparation materials, and does not contaminate the plating bath.

Additionally, many plating operations are carried out using surface masking techniques to provide a patterned deposition of the plated material. The mechanical and chemical compatibilities of the masking materials often place additional constraints on the types of surface preparation that can be performed before the plating process commences. For example, use of photoresist to pattern a plating substrate precludes the use of certain solvents to remove residual organic contamination from the exposed substrate plating base. Conventionally, to overcome this limitation, a vacuum plasma treatment (often referred to as "oxygen ashing") employs oxygen ions and atomic bombardment to remove organic residues on the exposed plating base. However, this technique has disadvantages such as:

1. Slow, batch-type throughput limitation,
2. Critical line dimensions of the photoresist pattern are often changed by the oxygen treatment,
3. Thickness of the photoresist is decreased by the oxygen treatment.
4. Oxygen treatment reacts with the exposed plating base surface and grows additional oxides which inhibit the initiation of the plating process and lead to plating non-uniformities.

Also any masking materials, such as photoresist, are hydrophobic and tend to inhibit the flow of plating bath solutions into fine geometries. This can result in a defect known as "skip plating" where small, isolated openings in the photoresist simply do not plate up at all, or begin to plate later than do more open, exposed geometries. What is needed is a surface preparation prior to plating of patterned substrates which does not substantially disturb the patterning medium mechanically or chemically or dimensionally, and also promotes excellent wetting of aqueous solutions to the patterning medium so that the finest patterned geometries can be plated without "skip".

Simultaneous Hydrophilization of Photoresist and Metal Surface Preparation: Methods, Systems, and Products The present application teaches new ways to perform plating in the manufacture of integrated circuits and multichip modules.

BRIEF DESCRIPTION OF THE DRAWINGS

The disclosed inventions will be described with reference to the accompanying drawings, which show important sample embodiments and which are incorporated in the specification hereof by reference, wherein.

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally.

Downstream active residuals of an atmospheric plasma as methods of creating an optimum surface condition to promote plating deposition of superior quality.

The instant inventions comprise process methods which utilize the downstream active residuals of a reducing-chemistry atmospheric plasma to provide multiple advantages to pre-plating surface preparation with a simple apparatus. As the downstream active species from the atmospheric plasma impinge the substrate surface, three important surface preparation processes can be performed simultaneously:

1. Organic residue is removed from the surface of the plating base.
2. Oxidation is removed from the surface of the plating base.
3. All surfaces on the substrate are highly activated by the downstream active residuals thus creating highly wettable surfaces for subsequent plating operations.

This combination of surface treatments utilizing downstream active residuals of an atmospheric plasma provides the following advantages to the overall plating process:

The surface treatment is fast and efficient and can be accomplished on a continuous throughput basis.

Vacuum chambers, gas pumps, and process confinement chambers are eliminated.

Wet chemical surface treatments (and their subsequent disposal) are eliminated.

Pre-wetting equipment and surfactants are eliminated.

Foreign particles introduced by vacuum chambers, wet processes and multiple handlings are eliminated.

The surfaces exposed to the plating solution are highly activated, thus greatly decreasing surface bubble masking and skip plating.

The surface of the plating base is chemically reduced toward native metal. This removes oxidation on the plating base metal, thus decreasing the plating initiation time and improving lateral uniformity of deposition.

The instant inventions comprise process methods which utilize the downstream residuals (i.e. neutral radicals, metastable energetic atoms) of an atmospheric plasma to provide multiple surface modification processes to prepare a surface for plating. Several key features of various disclosed embodiments include:

The selection of an atmospheric plasma source to provide downstream residuals to perform chemical modifications on the surface of the substrate. This allows the process to proceed in room ambient conditions, thus eliminating the expense and time limitations imposed by vacuum chambers, gas pumping systems, gas confinement chambers, etc.

The selection of specific reducing gas mixtures enables the efficient removal of organic contamination without the use of oxygen or oxidizing chemistry. The elimination of traditional oxygen-based treatments such as "oxygen ashing" has the advantage that it will not increase (and often can decrease) the thickness of oxidation on the surface of the substrate plating base. This leads to a faster and more uniform initial "strike" at the beginning of plating deposition.

The selection of appropriate gas precursors for the atmospheric plasma produces downstream residuals with highly efficient surface activation capabilities. These serve to dramatically increase the wetting of the plating solution to the surface of the substrate. This eliminates the tendency to form bubbles and voids on the plating base surface as the substrate is being introduced into the plating bath. This is even more important when the substrate is patterned with a Photoresist layer that is normally hydrophobic. The surface activation by the downstream active residuals of an atmospheric plasma causes the photoresist surface to strongly wet to the plating solution, thus drawing plating solution into the smallest openings in the photoresist pattern.

The selection of scan speed and gap between the plasma head and the substrate are important parameters in the surface preparation process. Scan speed alters the rate at which surface chemical reactions occur.

The addition of specific passivating chemistry in the atmospheric plasma gas mix can inhibit the re-growth of oxides on the surface of the plating base, thus enabling longer queue times between pre-plate surface preparation and the actual plating process. This passivation process is accomplished by adding a small amount of nitrogen gas into the atmospheric plasma mix. Care must be taken, however, to not nitridize the metal surface so much that plating nucleation is significantly impeded. For copper passivation, a low nitrogen flow on the order of 1% of total gas flow is typical. At this level of nitridation (approximately one monolayer of nitrogen on copper) plating nucleation is not significantly impeded.

Each of the above-mentioned key process features is described in more detail below.

Figure 1:
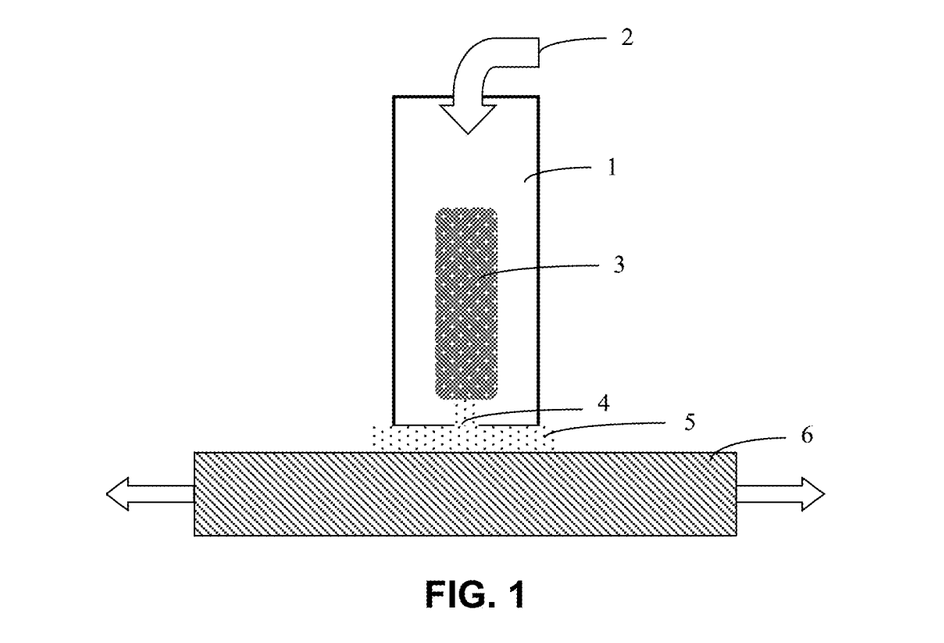
FIG. 1 shows an exemplary application of downstream active residuals from an atmospheric plasma head to a substrate prior to plating.

Use of an Atmospheric Plasma Source:

In the sample embodiment of FIG. 1, the substrate is scanned relative to the downstream gas flow, thus subjecting the substrate to uniform treatment by the downstream active species which were created in the plasma region inside the atmospheric plasma head. An atmosphere exclusion zone is created by the flow of process gas out of the plasma head exit aperture which then spreads laterally between the bottom surface of the plasma head and the substrate. An atmospheric plasma source (1) provides a convenient source of chemical radicals (e.g. monatomic hydrogen) and metastable noble gas atoms (e.g. metastable electron states of helium) (5) to perform surface modifications without the need for expensive vacuum chambers, pumping systems, and/or process gas confinement chambers. In addition to these benefits, certain types of atmospheric plasma sources—namely dielectric barrier discharge (DBD) low-temperature plasma sources such as the Ontos7 plasma source supplied by SETNA Corp.—confine the high-energy plasma region to the interior of the plasma source. By the time the gas flow (2) passes through the plasma region (3) and exits the aperture (4) in the bottom of the plasma source, all high-energy components such as ions, hot electrons, and kinetic bombardment species have lost their energy due to the high rate of particle collisions which occur under room pressure conditions. This ensures that the substrate (6) being treated does not suffer surface damage due to high-energy particles such as typically occurs in a vacuum plasma system. Also, because the downstream active residuals from an atmospheric plasma source have no significant kinetic energy, they do not destroy the atomic lattice structure at the immediate surface of the substrate under treatment. This results in a substrate surface that has a high degree of atomic order, while being free of organic and oxide contaminants thus enabling the highest possible "surface activation". Surfaces activated by atmospheric plasma downstream active residuals provide an extremely high level of surface activation to create highly wettable surfaces. This type of non-damaging surface activation is far superior to vacuumbased plasma systems which bombard the surface with ions, and create a "rubble" of dislodged surface atoms.

Selection of Specific Reducing Gas Mixtures

Figure 2A:
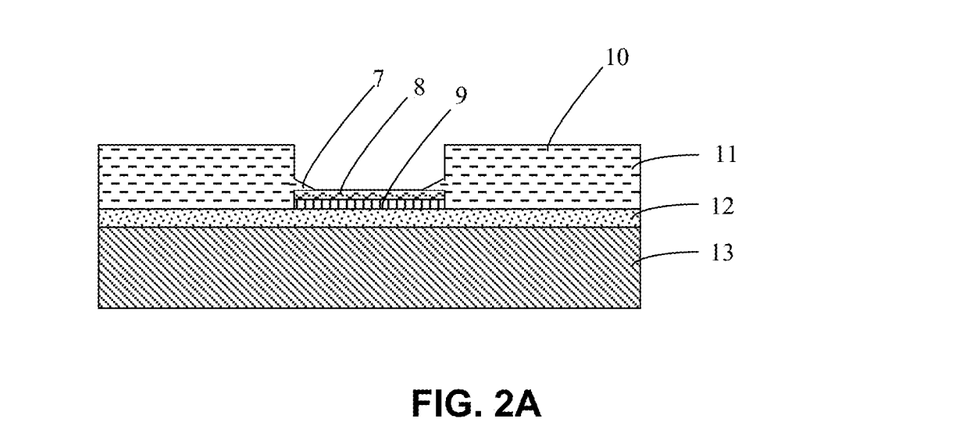
FIG. 2A shows a sample cross-section of a patterned plating substrate including the presence of oxidation on the plating base, organic contamination on the plating base, photoresist residue left in the bottom of the patterned feature after photoresist development, and a hydrophobic surface on the photoresist.
Figure 2B:
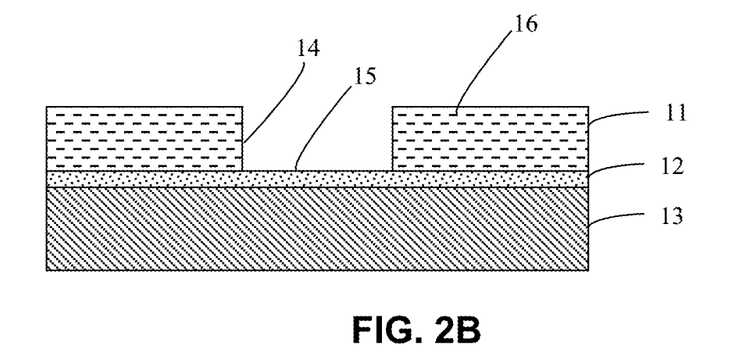
FIG. 2B shows a sample cross-section like that of FIG. 2A after treatment by downstream active species from an atmospheric plasma. The organic residues and oxidation have been removed, and all surfaces are activated for excellent wetting by aqueous plating solutions.

Removal of surface oxidation and organic contamination, due to air exposure and photoresist residue, are both important to efficient and uniform plating, especially during the nucleation phase of the plating process. The presence of either oxides or organics on the surface of the plating base will inhibit current flow between the plating base and the plating bath which is necessary for the electron-exchange process involved in plating. Oftentimes prior to blanket metal plating a solvent clean is performed to remove organics, followed by an acid pre-etch to remove oxides. Both of these procedures are known to introduce particles and additional contaminants to the surface which eventually end up in the plating bath, or worse yet as imperfections in the plating deposition itself. In semiconductor processing (refer to FIG. 2A) an organic photoresist mask (11) is used to pattern the plating base (12) to mask certain regions from the plating process. In this case, solvents cannot be used to remove organic or photoresist residues, for fear of altering or destroying the photoresist pattern. Oxygen ashing (in a vacuum chamber) is therefore often used to "de-scum" the photoresist pattern (7) and remove other organic components (8) from the plating base. However, this traditional oxygen-based processing grows an even thicker oxide on the surface of the plating base which must be removed before plating can begin. In addition, the oxygen plasma treatment often changes the dimensions of the photoresist pattern because it removes a significant amount of photoresist. The disclosed process method employs reducing chemistry downstream radicals produced by an atmospheric plasma. By careful selection of the gas mixture entering the atmospheric plasma head, both organic residue (7, 8) and metal oxidation (9) can be removed using the same chemistry and atmospheric plasma conditions resulting in a patterned plating base (FIG. 2B) which has an oxide-free and organic-free surface (15). This eliminates the need to perform separate steps for the removal of organics and oxides prior to plating. Typical gas mixtures include a carrier gas such as helium and a reducing gas such as hydrogen. Other carrier gasses (such as neon or argon) and reducing gasses (such as NH3) can be effective for this process, and are considered to fall under the purview of the instant invention disclosure. An optional addition of nitrogen into the gas mixture provides the additional advantage of atomic passivation of the de-oxidized plating base which allows the substrate to be stored in air for a longer period of time before the plating process begins. This nitrogen atomic passivation minimizes the consequences of re-oxidation of the plating base which can result in non-uniform nucleation of plating.

Selection of Appropriate Gas Precursors for Surface Activation

Figure 3:
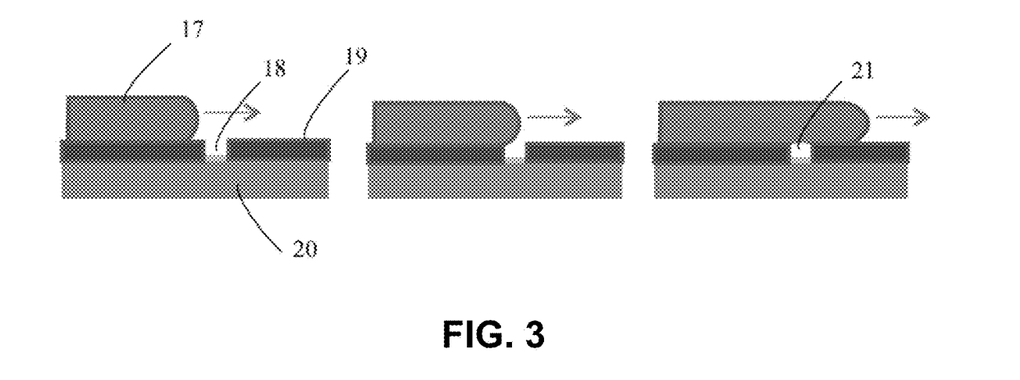
FIG. 3 shows one sample progression of flow of an aqueous solution over an untreated photoresist pattern. This illustrates how a bubble can be created in a small geometry when the surface patterning does not wet to the meniscus of the plating bath.
Figure 4:
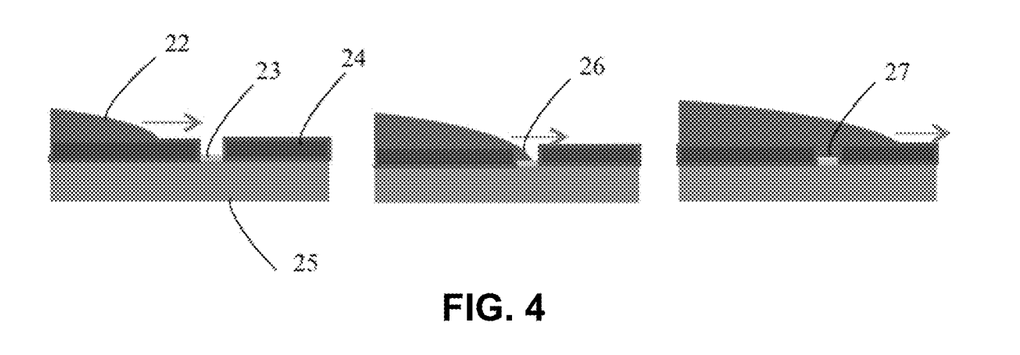
FIG. 4 shows one sample embodiment of how a small geometry in the masking pattern is readily wetted after surface activation due to downstream active residuals of an atmospheric plasma.

Atmospheric plasma has been shown to provide excellent surface activation to many different types of surfaces. FIG. 3 shows a patterned semiconductor wafer with a non-activated typical hydrophobic photoresist surface (19). As the plating solution (17) spreads over the hydrophobic photoresist surface, a high contact angle or even re-entrant meniscus is formed. As this meniscus moves over a small opening in the photoresist (18), the plating solution does not wet down the hydrophobic sidewalls of the opening, and the meniscus tends to flow around and then over the opening forming a bubble (21). Conversely, FIG. 4 shows a patterned semiconductor wafer with a hydrophilic photoresist surface which has been activated by atmospheric plasma. As the plating solution (22) spreads over the hydrophilic photoresist surface (24), a low contact angle meniscus is formed. As this meniscus moves over a small opening in the photoresist (23), the plating solution wets down the hydrophilic sidewalls of the opening and across the activated hydrophilic plating base (26), so the meniscus tends to fill the entire opening without forming any bubbles (27). Air, nitrogen, helium, hydrogen, argon, oxygen and mixtures thereof have been discussed in the literature as precursors for atmospheric plasma surface activation. However, air and oxygen can produce undesirable surface reactions with the plating base which inhibit plating initialization. Air and oxygen can also affect critical photoresist dimensions in semiconductor applications. So to provide the best surface activation while leaving the plating base in the best condition for plating, and having minimum effect on photoresist, a combination of helium and hydrogen (and optional nitrogen) is the presently-most-preferred implementation. Pure helium or pure argon or a mixture of argon and hydrogen could also be used, but they are less efficient at surface activation and would require additional passes by the atmospheric plasma head, whereas helium/hydrogen/optional nitrogen, in the same ratio as used above for oxide reduction, can accomplish the surface activation task at the same time as the plating base oxides and organics are being removed.

Figure 5:
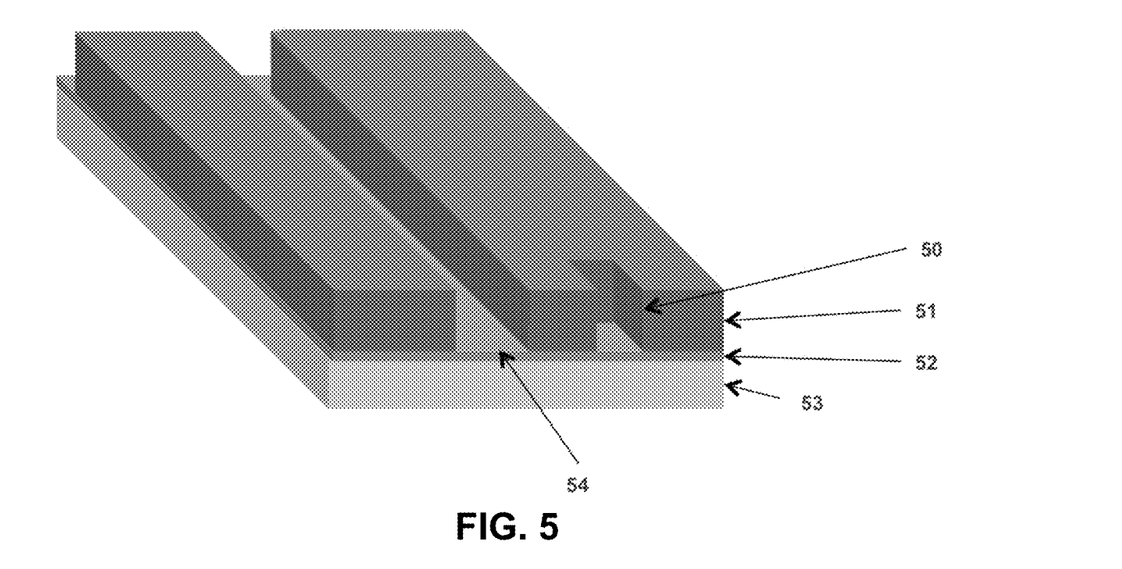
FIG. 5 shows some examples of features which can be treated according to the present inventions.

In the sample embodiment of FIG. 5, photoresist layer 51 has both smaller "isolate" feature 50 and extended trench feature 54 penetrating down to blanket metal layer/plating base 52 (but not through to underlying wafer 53).

Selection of Appropriate Scan Speed and Gap

An essential factor in the use of an atmospheric plasma head to perform chemical modification of surfaces is the exclusion of room air from the chemical reaction zone. FIG. 1 shows how the gas that transits the interior of the plasma head then exits an aperture in the bottom face of the plasma head and flows laterally between the substrate and the bottom surface of the plasma head. This lateral flow continually purges room air from the reaction zone directly under the plasma head. It is the absence of room air (mainly oxygen) that allows the reducing chemistry to stay at a high-enough density to perform reducing chemical reactions on the surface of the substrate. Any incursion of room air into the reaction zone reduces the efficiency of the downstream radical reactions. The selection of appropriate scan parameters and gap parameters are necessary to achieve maximum effect of the downstream active residuals on the substrate. Scan rate is governed by trade-offs in throughput vs. substrate heating vs. process reaction time vs. atmosphere exclusion kinetics. For throughput purposes, a higher scan speed is clearly desirable. A higher scan speed also minimizes heating of the substrate due to thermal exchange with the thermally excited gas flowing out of the plasma head. However, at higher scan speeds there is less time for the room air to be purged from the reaction zone, and therefore the reaction speed decreases. Similarly, if the gap is too large between the plasma head and the substrate more room air will remain in the reaction zone. However, if the gap is too small, additional heating of the substrate can occur which will leave the surface of the substrate still warm when it exits the exclusion zone as the scan proceeds. This can lead to re-oxidation of the just-reduced surface. Multivariable designed experiments have determined a range of gap and scan speed that produces optimum results. Typical scan speeds run from 1 mm/second up to 15 mm/second depending on how much organic and oxide removal is required. Typical gap spacing between the plasma head bottom surface and the substrate top surface is between 0.5 mm and 1.5 mm, depending on scan speed and reoxidation rate of the plating base material.

An additional process step found valuable, if a photoresist surface must stay highly activated for longer period of time (e.g. overnight), is to terminate the freshly activated surface states with water molecules (e.g. dip the wafer in DI water and then blow dry with nitrogen). The water molecules are attracted to the polar activated surface atoms and bond to them. This stabilizes the activated surface and prevents the adsorption/chemisorption of atmospheric contaminants which would impede wetting (such as oxygen and carbon) for a longer period of time. It has been found that such water molecule termination immediately after activation with atmospheric plasma extends the wettability of the surface for aqueous solutions to at least 24 hours. Even if some oxide remains after the surface has been exposed to reducing chemistry (e.g. due to imperfect or incomplete reduction processes), the surface still becomes "active" in that the downstream process gas flow makes the surface polar enough to wet easily, and the wetting of the metal is important in preventing bubbles. Alternate methods of providing water molecules to the activated surface include, among others:
1. Atomized water, such as a "fog" over the wafer,
2. Steam
3. Water vapor passed through an atmospheric plasma source.

Supporting Data

There are 5 primary performance aspects of the present inventions:
1. Descumming of photoresist residue
2. Removal of oxidation from plating base
3. Activation of photoresist for wetting down into small photoresist apertures
4. Optional passivation of de-oxidized plating base against reoxidation by N2 included in downstream active chemistry
5. Optional preservation of surface activation by introducing H2O molecules after treatment.

The uniqueness of these inventions is that the first four of these aspects can be accomplished simultaneously with a single process and apparatus.

Descum of Photoresist Residue

Figure 6:
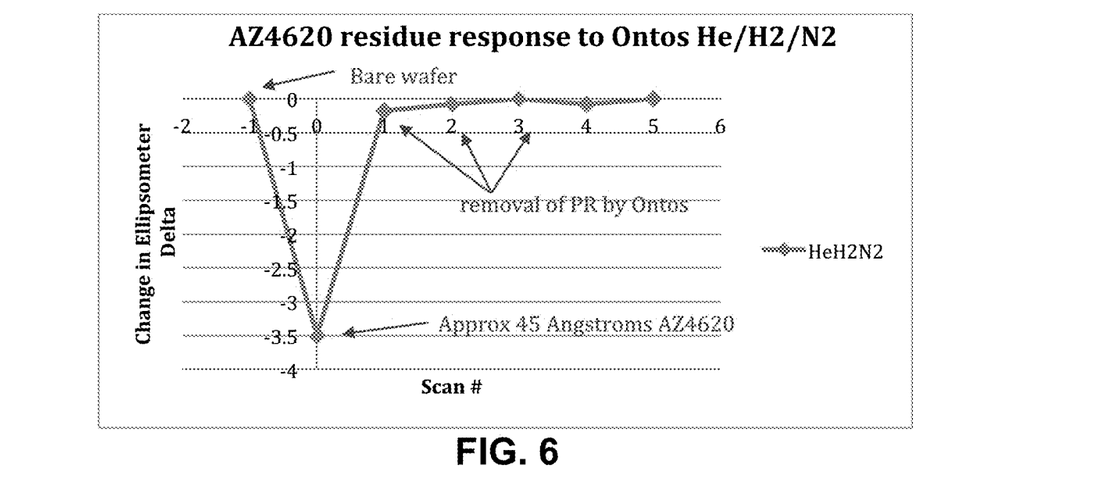
FIG. 6 shows one sample plot of the removal of photoresist residue by downstream reducing chemistry.

It is broadly recognized in semiconductor processing that there exists a slight residue of photoresist material (referred to as "scum") in the bottom of a developed-out photoresist pattern. Oxygen ashing in a vacuum system is most often used to remove this scum. In the present inventions, a reducing chemistry (i.e. hydrogen-based excited species) is used to remove post-develop photoresist scum, while having the advantage that any existing oxide on the surface of the exposed plating base is reduced instead of growing more oxide, as occurs with oxygen-based de-scumming processes. In FIG. 6, an SiO2-coated silicon wafer was overcoated with a very dilute solution of photoresist (AZ4620) in acetone, and then dried on a hotplate. Ellipsometer readings indicate removal of the photoresist scum in 1-2 scans of reducing chemistry downstream products of atmospheric plasma.

Removal of Oxidation from Plating Base

Figure 7:
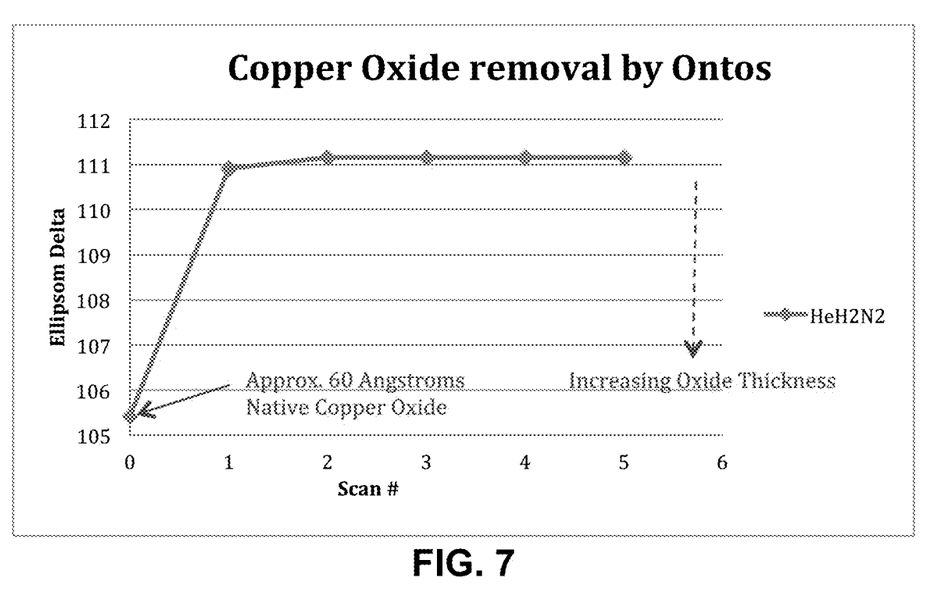
FIG. 7 shows one sample plot of the removal of copper oxide by downstream reducing chemistry.

A thin layer of copper is most often used as a plating base in semiconductor manufacturing, as in the "Copper Damascene" process. Copper, when exposed to the atmosphere, oxidizes, growing a layer of CuO on the exposed surface. The presence of an oxide inhibits the passage of electrical current through the plating base to the plating solution. This oxidation results in variable nucleation of plating onto the plating base, and therefore undesirable non-uniformities in plating thickness. Traditional descumming of photoresist with oxygen serves only to increase the thickness of this oxidation layer. In the present inventions, a reducing chemistry (i.e. hydrogen-based excited species) is used to remove oxidation from the plating base. FIG. 7 shows the removal of copper oxide employing the same He/H2/N2 parameters as the descumming plot of FIG. 6. Ellipsometer readings indicate removal of the native copper oxide in 1-2 scans of Ontos atmospheric plasma.

Activation of Photoresist

Figure 8A:
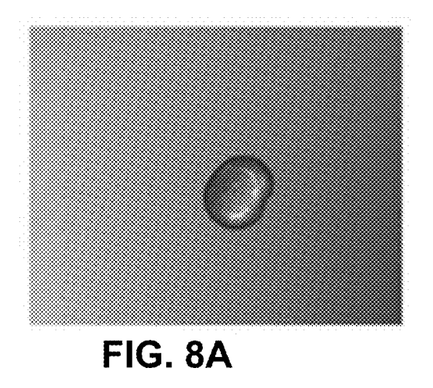
FIGS. 8A, 8B, 8C, and 8D show examples of comparative activation of photoresist patterns to allow wetting of aqueous solution down into high-aspect photoresist vias.
Figure 8B:
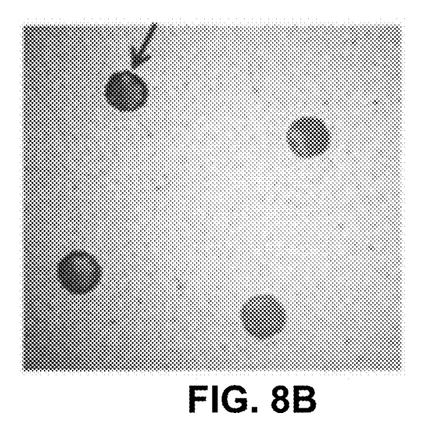

Small photoresist apertures are notorious for inhibiting flow of aqueous solutions into high-aspect-ratio photoresist patterns. This is due to the normal non-wetting nature of photoresist resin. The sample embodiments of FIGS. 8A-8D show small apertures in a photoresist pattern, imbued with a drop of aqueous solution. FIG. 8A demonstrates the poor wetting of the solution to the photoresist layer, on a macro scale. In FIG. 8B, at higher magnification, bubbles can be observed at the top of each aperture, indicating that the solution was not wetting the photoresist well enough to flow down into the small apertures.

Figure 8C:
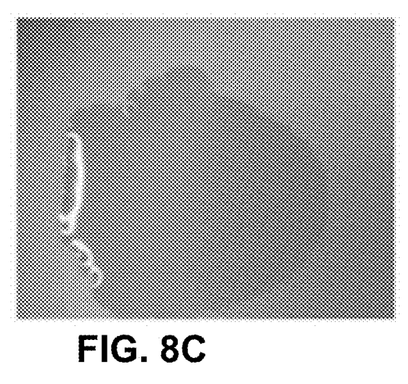
Figure 8D:
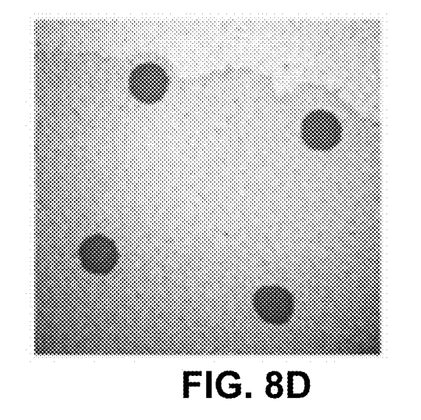

In contrast, FIGS. 8C and 8D show the wetting of the photoresist on a macro scale, and wetting down into the small vias (no bubbles) produced by the application of downstream reducing chemistry from an atmospheric plasma source. The downstream process parameters which produced this effect were the same as used in the previous two sections.

Optional Passivation of De-Oxidized Plating Base Against Reoxidation by N2

Figure 9:
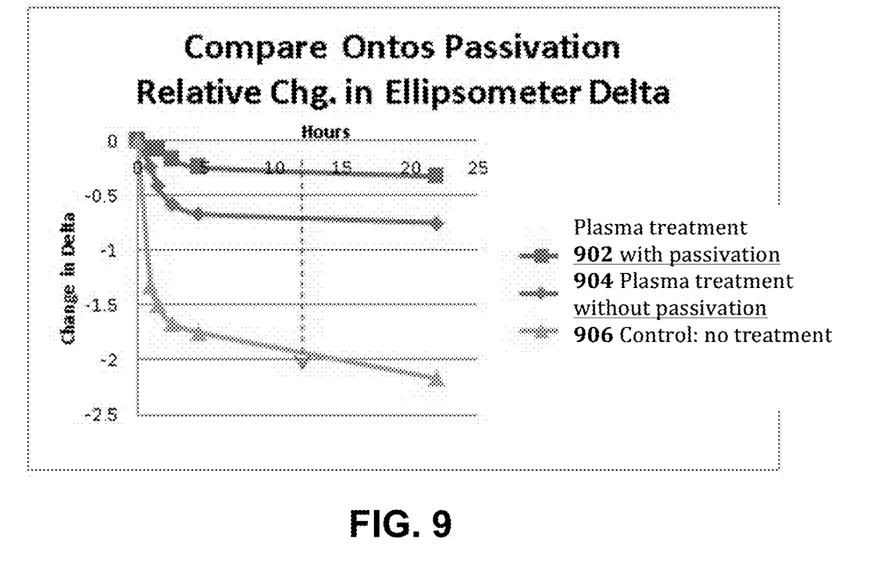
FIG. 9 shows an exemplary plot of the reoxidation of copper at room temperature under various conditions.

The above 3 aspects of these inventions could just as well be accomplished without the presence of nitrogen in the downstream. However, with the addition of N* (nitrogen radicals) in the downstream from the atmospheric plasma, the de-oxidized copper plating base can be passivated to inhibit re-oxidation of the copper with exposure to air. The sample plot of FIG. 9 shows the re-oxidation of copper (measured in terms of ellipsometer Delta) as a function of time for three different conditions: 902, passivated copper treated with He/H2/N2; 904, unpassivated copper treated with He/H2 only; and 906, fresh clean copper with no surface treatment.

For passivated condition 902, the decrease in Delta value of less than ½ degree over 22 hours signifies a regrowth of only one monolayer of oxide on the surface. Untreated freshly exposed copper, for control condition 906, has grown approximately 7× this amount over the same 22 hour period in room ambient conditions.

Optional Passivation of Activated Surfaces by Exposure to H$_2$O

Figure 10A:
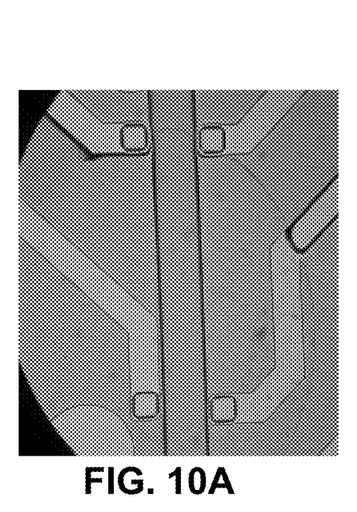
FIGS. 10A, 10B, and 10C show exemplary wetting characteristics of photoresist over a copper plating base for various treatment conditions.
Figure 10B:
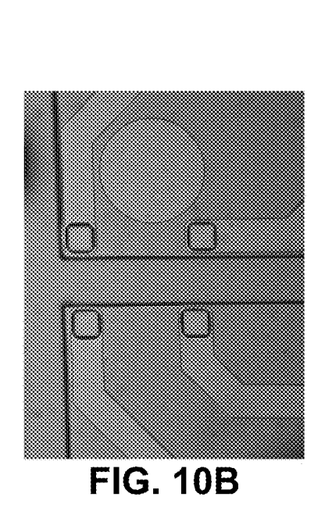
Figure 10C:
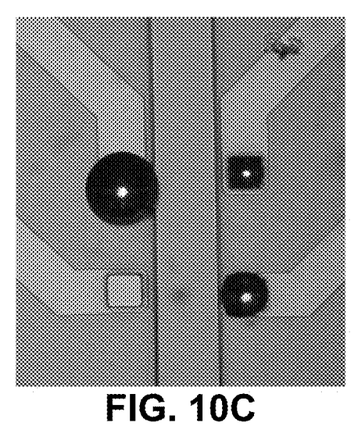

Although the addition of nitrogen adequately passivates the plating base against re-oxidation, the surface activation of the copper and photoresist eventually succumb to airborne oxygen and carbon thus losing their polarity and surface wetting capability. This can be characterized by the formation of more and more bubbles in the bottom of fine geometries. If the substrate is treated with H$_2$O after the downstream surface treatment described above, available H$_2$O molecules will bind to the activated surface and remain as a physisorbed monolayer on the surface. These physisorbed water molecules are stable in air and will remain on the surface for many days. Their presence inhibits the attachment of oxygen or carbon to the substrate surface. Even days later, this layer of water molecules remains attractive to aqueous solutions and enables exceptional wetting on all surfaces. The sample embodiments of FIGS. 10A-10C show three comparative photographs. FIG. 10A shows the wetting capability of both photoresist and copper plating base immediately after downstream treatment as described above. There are no bubbles present due to the exceptional wetting properties of the as-treated film. FIG. 10B shows the same wafer 24 hours later after being re-introduced to an aqueous solution—there are no bubbles present because the wetting properties of the surfaces was preserved by the first water exposure. The wafer in the sample embodiment of FIG. 10C received downstream treatment, but was left in air for 24 hours. Bubbles are seen in the geometries, indicating that the surfaces have lost much of their wetting properties.

A first preferred sample embodiment of the instant inventions is as follows:

1. Substrate to be plated: Silicon wafer with copper plating base and photoresist plating mask.
2. Atmospheric Plasma source: SETNA Ontos7 dielectric barrier discharge remote plasma head with 25 mm aperture and RF power=100 Watts.
3. Gas flow parameters: helium=10 Standard Liters Per Minute (SLPM), hydrogen=0.16 SLPM, nitrogen=0.1 SLPM.
4. Scan parameters: scan speed=3 mm/sec; gap between plasma head and substrate=1 mm; rastered across wafer surface with overlap between neighboring scans=0 mm; 1 to 4 passes over the wafer depending on the extent of organic and/or oxide contamination.

A second preferred sample embodiment of the instant inventions is as follows:

1. Substrate to be plated: Silicon wafer with copper plating base and photoresist plating mask.
2. Atmospheric Plasma source: SETNA OntosPRO dielectric barrier discharge remote plasma head with 200 mm aperture and RF power=800 Watts.
3. Gas flow parameters: helium=80 Standard Liters Per Minute (SLPM), hydrogen=1.28 SLPM, nitrogen=0.8 SLPM.
4. Scan parameters: scan speed=3 mm/sec, gap between plasma head and substrate=1 mm, 1 to 4 passes over the wafer depending on the extent of organic and/or oxide contamination.

A third preferred sample embodiment is as follows:

1. Substrate to be plated: Silicon wafer with copper plating base and photoresist plating mask.
2. Atmospheric Plasma source: SETNA OntosPRO dielectric barrier discharge remote plasma head with 300 mm aperture and RF power=1200 Watts.
3. Gas flow parameters: helium=120 Standard Liters Per Minute (SLPM), hydrogen=1.92 SLPM, nitrogen=1.4 SLPM.
4. Scan parameters: scan speed=3 mm/sec, gap between plasma head and substrate=1 mm, 1 to 4 passes over the wafer depending on the extent of organic and/or oxide contamination.

A fourth preferred sample embodiment is as follows:

1. Same conditions as the first, second, and third preferred embodiments, except without the nitrogen, where passivation of the plating base is not an issue.

A fifth preferred sample embodiment is as follows:

1. Same conditions as the first, second and third preferred embodiments, except employing a pre-scan with oxygen-based atmospheric plasma to remove excessive organic contamination, if photoresist critical dimensions will allow (or if the substrate is unpatterned).
2. Oxygen atmospheric plasma process conditions: same as reducing plasma parameters listed above except remove hydrogen flow and replace nitrogen with oxygen.
3. Oxygen scan(s) to be followed by reducing scans as described in first, second, and third preferred embodiments.

A sixth preferred sample embodiment is as follows:

1. Same conditions as the first through fifth preferred embodiments, with the addition of a water molecule passivation applied to the activated surface to extend surface wettability to aqueous solutions to longer timeframes.
2. Water molecule introduction is accomplished by bringing the substrate in contact with liquid water, then blowing dry the substrate with nitrogen or spinning dry.

A seventh preferred sample embodiment is as follows:

1. Same procedure as sixth preferred embodiment except the water molecules are introduced from a source of water vapor in the form of an atomized water mist, or steam.

An eighth preferred sample embodiment is as follows:

1. Same procedure as sixth preferred embodiment except the water molecules are subsequently introduced from the atmospheric plasma source as follows:
2. Atmospheric Plasma source: SETNA Ontos7 dielectric barrier discharge remote plasma head with 25 mm aperture and RF power=100 Watts. (Or OntosPRO 200 mm=800 Watts, or OntosPRO 300 mm=1200 Watts.)
3. Gas flow parameters: helium=10 Standard Liters Per Minute (SLPM) containing water vapor from a water bubbler. (Or OntosPRO 200 mm=80 SLPM, or OntosPRO 300 mm=120 SLPM.)
4. Scan parameters: scan speed=5 mm/sec, gap between plasma head and substrate=1 mm, rastered across wafer surface with overlap between neighboring scans=1 mm, 1 pass over the wafer.

It is to be understood that the present inventions should not be limited to the above described embodiments, but can be practiced in various forms within the scope of the present inventions. Variations in process parameters, such as plasma head manufacturer, RF power, gas composition, gas flow ratios, gas flow rates, scan speed, gap and number of passes, may be viable to accomplish the same process goals within the bounds of the present inventions.

The instant inventions comprise process methods which utilize the downstream active residuals of a reducing-chemistry atmospheric plasma to provide multiple advantages to pre-plating surface preparation with a simple apparatus. As the downstream active species of the atmospheric plasma impinge the substrate surface, three important surface preparation processes can be performed simultaneously:

1. Organic residue is removed from the surface of the plating base.
2. Oxidation is removed from the surface of the plating base.
3. All surfaces on the substrate are highly activated by the downstream active residuals thus creating highly wettable surfaces for subsequent plating operations.

This combination of surface treatments utilizing downstream active residuals of an atmospheric plasma provides the following advantages to the overall plating process:

1. The surface treatment is fast and efficient and can be accomplished on a continuous throughput basis.
2. Vacuum chambers, gas pumps, and process confinement chambers are eliminated.
3. Wet chemical surface treatments (and their subsequent disposal) are eliminated.
4. Pre-wetting equipment and surfactants are eliminated.
5. Foreign particles introduced by vacuum chambers, wet processes and multiple handlings are eliminated.
6. The surfaces exposed to the plating solution are highly activated, thus greatly decreasing surface bubble masking and skip plating.

7. The surface of the plating base is reduced toward native metal thus decreasing the plating initiation time and improving lateral uniformity of deposition.

Advantages

The disclosed innovations, in various embodiments, provide one or more of at least the following advantages. However, not all of these advantages result from every one of the innovations disclosed, and this list of advantages does not limit the various claimed inventions.

The skip problem in electroplating has been solved.

Yield is increased.

The time constraints on the sequence of operations for electroplating have been relaxed.

Electroplating can be used in smaller geometries without undue yield degradation.

According to some but not necessarily all embodiments, there is provided: Methods and systems for using the downstream active residuals of a reducing-chemistry atmospheric plasma to provide multiple advantages to pre-plating surface preparation with a simple apparatus. As the downstream active species of the atmospheric plasma impinge the substrate surface, three important surface preparation processes can be performed simultaneously: 1. Organic residue is removed from the surface of the plating base. 2. Oxidation is removed from the surface of the plating base. 3. All surfaces on the substrate are highly activated by the downstream active residuals thus creating a highly wettable surface for subsequent plating operations.

According to some but not necessarily all embodiments, there is provided: A method of integrated circuit manufacturing, comprising the sequential actions of: a) making a wafer of partially fabricated integrated circuits, which includes a blanket layer of metal; b) applying an organic photoresist material to the wafer of partially fabricated integrated circuits, and patterning the photoresist material to form apertures therein over predetermined locations in the blanket layer of metal; c) flowing a gas stream through a plasma discharge to produce an activated gas stream which flows over the patterned photoresist material; wherein the activated gas stream includes plasma-activated reducing species, includes energized helium atoms, includes plasma-activated nitrogen, and is flowed at approximately atmospheric pressure, in close proximity to the wafer so as to exclude room atmosphere from the surface of the photoresist; d) electroplating a conductive material onto the layer of metal at the predetermined locations, using a plating bath, to thereby form plated metal layers at the locations of the apertures; whereby step c) performs descumming of the patterned photoresist without need for ashing, and makes the photoresist material more hydrophilic, and reduces oxides on the metal areas, and passivates the metal areas against re-oxidation; whereby the plating bath wets the exposed metal layer, and photoresist material, including the sidewalls of the apertures, and thereby avoids the formation of bubbles as the plating bath flows across the apertures.

According to some but not necessarily all embodiments, there is provided: A method of integrated circuit manufacturing, comprising the sequential actions of: a) making a wafer of partially fabricated integrated circuits which includes a blanket layer of metal; b) applying an organic photoresist material to the wafer, and patterning the photoresist material to form apertures therein over predetermined locations; c) flowing a gas stream through a plasma discharge to produce an activated gas stream which flows over the patterned photoresist material; wherein the activated gas stream includes plasma-activated reducing species, includes energized noble gas atoms, and is flowed at approximately atmospheric pressure in close proximity to the wafer so as to exclude room atmosphere from the surface of the photoresist; d) plating a conductive material onto the metal areas at the aperture locations, using a plating bath, to thereby form plated metal layers at the locations of the apertures; whereby step c) performs descumming without need for ashing, and makes the photoresist material more hydrophilic, and reduces oxides on the metal areas; whereby the plating bath wets the photoresist material, including the sidewalls of the apertures, and thereby avoids the formation of bubbles as the plating bath flows across the apertures.

According to some but not necessarily all embodiments, there is provided: A method of integrated circuit manufacturing, comprising the sequential actions of: a) making a wafer of partially fabricated integrated circuits, which includes a blanket layer of metal; b) applying an organic photoresist material to the partially fabricated integrated circuit, and patterning the photoresist material to form apertures therein exposing predetermined locations in the blanket layer of metal; c) flowing a plasma-activated gas stream over the patterned photoresist material, to thereby make the surface thereof more hydrophilic; c2) temporarily wetting the patterned photoresist material with an aqueous solution, to thereby stabilize and preserve the activation thereof by the mechanism of terminating activated surface bonds with polar molecules; d) plating a conductive material onto the metal areas at the predetermined pad locations, using a plating bath, to thereby form plated metal layers at the locations of the apertures; whereby, even after extended periods of time, the plating bath wets the exposed metal layer, and photoresist material, including the sidewalls of the apertures, and thereby eliminates the formation of bubbles as the plating bath flows across the apertures and the metal layer.

According to some but not necessarily all embodiments, there is provided: A method of integrated circuit manufacturing, comprising the sequential actions of: a) making a wafer of partially fabricated integrated circuits which includes a blanket layer of metal; b) applying an organic photoresist material to the wafer, and patterning the photoresist material to form apertures therein over predetermined locations; c) flowing a gas stream through a plasma discharge to produce an activated gas stream which flows over the patterned photoresist material; wherein the activated gas stream includes plasma-activated reducing species, includes energized noble gas atoms, includes plasma-activated nitrogen, and is flowed at approximately atmospheric pressure in close proximity to the wafer so as to exclude room atmosphere from the surface of the photoresist; d) electroplating a conductive material onto the layer of metal at the predetermined locations, using a plating bath, to thereby form plated metal layers at the locations of the apertures; whereby step c) performs descumming without need for ashing, and makes the photoresist material more hydrophilic, and reduces oxides on the metal areas, and passivates the metal areas against re-oxidation; whereby the plating bath wets the exposed metal layer, and photoresist material, including the sidewalls of the apertures, and thereby avoids the formation of bubbles as the plating bath flows across the apertures.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is, among others (and, without exclusion, in addition to any other points which are indicated herein as inventive and/or surprising and/or advantageous):

1. A method of integrated circuit manufacturing, comprising the sequential actions of:
   a) making a wafer of partially fabricated integrated circuits, which includes a blanket layer of metal;
   b) applying an organic photoresist material to the partially fabricated integrated circuit, and patterning the photoresist material to form apertures therein exposing predetermined locations in the blanket layer of metal;
   c) flowing a plasma-activated gas stream over the patterned photoresist material, to thereby make the surface thereof more hydrophilic;
   c2) temporarily wetting the patterned photoresist material with an aqueous solution, to thereby stabilize and preserve the activation thereof by the mechanism of terminating activated surface bonds with polar molecules;
   d) plating a conductive material onto the blanket layer of metal at the predetermined locations, using a plating bath, to thereby form plated metal layers at the predetermined locations of the apertures; and
   e) stripping the photoresist;
   whereby, even after extended periods of time, the plating bath wets the exposed blanket layer of metal, and patterned photoresist material, including sidewalls of the apertures, and thereby eliminates the formation of bubbles as the plating bath flows across the apertures and the blanket layer of metal.

2. A method of integrated circuit manufacturing, comprising the sequential actions of:
   a) making a wafer of partially fabricated integrated circuits which includes a blanket layer of metal;
   b) applying an organic photoresist material to the wafer, and patterning the photoresist material to form apertures therein over predetermined locations;
   c) flowing a gas stream through a plasma discharge to produce an activated gas stream which flows over the patterned photoresist material; wherein the activated gas stream includes plasma-activated reducing species, includes energized noble gas atoms, includes plasma-activated nitrogen, and is flowed at approximately atmospheric pressure in close proximity to the wafer so as to exclude room atmosphere from a surface of the patterned photoresist material;
   d) electroplating a conductive material onto the blanket layer of metal at the predetermined locations, using a plating bath, to thereby form plated metal layers at the predetermined locations of the apertures;
   whereby step c) performs descumming without need for ashing, and makes the patterned photoresist material more hydrophilic, and reduces oxides on the blanket layer of metal, and passivates the blanket layer of metal against re-oxidation;
   whereby the plating bath wets the exposed blanket layer of metal, and patterned photoresist material, including sidewalls of the apertures, and thereby avoids the formation of bubbles as the plating bath flows across the apertures.

3. The method of claim 2, wherein the apertures include extended trenches as well as smaller isolated features.

4. The method of claim 2, wherein the apertures have a maximum depth which is larger than their minimum width.

5. The method of claim 2, further comprising the additional step, after step c) and before step d), of temporarily wetting the patterned photoresist material to thereby stabilize and preserve the activation thereof.

6. The method of claim 2, wherein the noble gas is helium.

7. The method of claim 2, wherein step b) applies the organic photoresist material to all of a surface of the wafer except for a narrow band around an edge of the surface of the wafer.

8. The method of claim 2, further comprising the subsequent step of stripping the patterned photoresist material.

* * * * *